United States Patent
Fainchtein

(10) Patent No.: US 6,853,187 B2
(45) Date of Patent: Feb. 8, 2005

(54) FORCE DETECTED MAGNETIC FIELD GRADIOMETER

(75) Inventor: Raul Fainchtein, Potomac, MD (US)

(73) Assignee: The Johns Hopkins University, Baltimore, MD (US)

(*) Notice: Subject to any disclaimer, the term of this patent is extended or adjusted under 35 U.S.C. 154(b) by 0 days.

(21) Appl. No.: 10/239,662

(22) PCT Filed: Mar. 9, 2001

(86) PCT No.: PCT/US01/07583

§ 371 (c)(1),
(2), (4) Date: Sep. 24, 2002

(87) PCT Pub. No.: WO01/67122

PCT Pub. Date: Sep. 13, 2001

(65) Prior Publication Data

US 2003/0222649 A1 Dec. 4, 2003

Related U.S. Application Data

(60) Provisional application No. 60/188,058, filed on Mar. 9, 2000.

(51) Int. Cl.[7] .................................................. G01V 3/00
(52) U.S. Cl. ....................................... 324/300; 324/307
(58) Field of Search ................................ 324/300, 307, 324/310, 322, 318; 75/105

(56) References Cited

U.S. PATENT DOCUMENTS

| | | | |
|---|---|---|---|
| 3,924,176 A | 12/1975 | Fletcher et al. ................ 324/43 |
| 5,017,010 A | 5/1991 | Mamin et al. ............... 356/345 |
| 5,266,896 A | * 11/1993 | Rugar et al. ................. 324/307 |
| 5,315,247 A | 5/1994 | Kaiser et al. ................ 324/244 |
| 5,442,288 A | 8/1995 | Fenn et al. .................. 324/244 |
| 5,481,189 A | 1/1996 | DiLella ....................... 324/259 |
| 5,530,348 A | 6/1996 | Heflinger .................... 324/301 |
| 5,623,205 A | 4/1997 | Tomita et al. ............... 324/244 |
| 5,739,686 A | 4/1998 | Naughton et al. | |
| 5,818,227 A | 10/1998 | Payne et al. ................ 324/259 |
| 5,998,995 A | 12/1999 | Osiander et al. ............ 324/259 |
| 6,037,769 A | 3/2000 | Hoon et al. ................. 324/228 |
| 6,100,687 A | * 8/2000 | Weitenkamp et al. ....... 324/300 |
| 6,181,131 B1 | * 1/2001 | Bruland et al. ............. 324/300 |
| 6,429,652 B1 | 8/2002 | Allen et al. ................. 324/259 |
| 6,433,543 B1 | 8/2002 | Shahinpoor et al. ..... 324/244.1 |

FOREIGN PATENT DOCUMENTS

DE 43 35 486 A1 * 5/1994

OTHER PUBLICATIONS

Temperature Measurement at the End of a Cantilever Using Oxygen Paramagnetism; by Thurber, KR; Harrell LE and Smith, DD (abstract)vol. 93 no. 7(2003), Journal of Applied Physics.

Micromechanical Detectors for Ferromagnetic Resonsncs Spectroscopy; by Moreland, J; Kabos, P; Jander A; Loehndorf M; McMichael R; and Lee, C. Proceedings of SPIE, vol. 4176 pp 84–95 (abstract).

The activated torsion oscillation magnetometer (ATOM); by Asti, G; Ghidini M.; Pellicelli R; and Solzi M. vol. 242–245 Journal of Magnetism Apr. 2002 (abstract).

Temperature Measurement at the End of a Cantilever Using Oxygen Paramagnetism; by Thurber, LE; Kent R. Harrell and Doran D. Smith, Journal of Applied Physics Apr. 1, 2003 93(7) pp 4297–4299 (abstract).

* cited by examiner

Primary Examiner—Brij B. Shrivastav
(74) Attorney, Agent, or Firm—Benjamin Y. Roca

(57) ABSTRACT

Apparatus and method for detecting and quantifying magnetic field gradients by measuring the magnetic force acting on a mechanical oscillator with an attached spin-containing material (any material that displays a magnetic moment in the presence of a magnetic field) having a modulated magnetic moment with a temporal response that matches the resonance frequency of the mechanical oscillator. Modulation of the magnetic moment in the direction of the measurement is achieved by the action of a spatially uniform polarizing field with a temporal response that matches the resonance frequency of the mechanical oscillator.

7 Claims, 5 Drawing Sheets

FORCE DETECTED MAGNETIC FIELD GRADIOMETER

This application in a 371 of PCT/US01/07583 filed Mar. 9, 2001, which claims benefit of 60/188,058 filed Mar. 9, 2000.

BACKGROUND OF THE INVENTION

1. Field of the Invention

The present invention relates to an apparatus and method for detecting and quantifying magnetic field gradients and their effects by measuring magnetically induced forces acting on a spin-containing particle mounted on a mechanical oscillator. A spin-containing particle may include any material that displays a magnetic moment in the presence of a magnetic field. The spin-containing particle has a modulated magnetic moment with a temporal response that matches the resonance frequency of the mechanical oscillator due to the action of a spatially uniform polarizing field that has a temporal response that matches the resonance frequency of the mechanical oscillator.

2. Related Art

Related Art relevant to the present invention includes:

[1] U.S. Pat. No. 5,266,896, 1993, D. Rugar, J. Sidles, and C. Yannoni, "Mechanical detection and imaging of magnetic resonance by magnetic moment modulation,"

[2] U.S. Pat. No. 5,017,010, 1991, H. J. Mamin and D. Rugar, "High sensitivity position sensor and method,"

[3] S. J. Swithenby, "SQUIDS and their applications in the measurement of weak magnetic fields," *J. Phys. E: Sci. Instrum.*, vol. 13, pp. 801–813, 1980.

[4] D. F. L. Jenkins, M. J. Cunningham, W. W. Clegg, and M. M. Bakush, "Measurement of the modal shapes of inhomogeneous cantilevers using optical beam deflection," *Meas. Sci. Technol.*, vol. 6, pp. 160–166, 1995.

[5] S. Rast, C. Wattinger, U. Gysin, and E. Meyer, "The noise of cantilevers," *Nanotechnology*, vol. 11, pp. 169–172, 2000.

[6] T. R. Albrecht, P. Grütter, D. Rugar, and D. P. E. Smith, "Low-temperature force microscope with all-fiber interferometer," *ultramicroscopy*, vol. 42–44, pp. 1638–1646, 1992.

[7] T. D. Stowe, K. Yasumura, T. W. Kenny, D. Botkin, K. Wago, and D. Rugar, "Attonewton force detection using ultrathin silicon cantilevers," *App. Phys. Lett.*, vol. 71, pp. 288–290, 1977.

[8] J. A. Marohn, R. Fainchtein, and D. D. Smith, "An optimal magnetic tip configuration for magnetic resonance force microscopy of microscale buried features," *Applied Physics Letters*, vol. 73, pp. 3778–3780, 1998.

SUMMARY OF THE INVENTION

Magnetic field gradients are the directional spatial variations of a magnetic field H (the first derivative of H for a given direction) with respect to coordinates of the magnetic field. The purpose of a magnetic field gradiometer is to measure magnetic field gradients; while being substantially insensitive to any uniform magnetic field $H_u$ present. The apparatus and method of the present invention detect and measure magnetic field gradients substantially independent of any uniform magnetic field $H_u$. The present invention achieves this by measuring magnetically induced forces acting on a spin-containing particle mounted on a mechanical oscillator. The magnetic dipole force experienced by a spin-containing particle with a magnetic moment m interacting with a magnetic field gradient is measured by attaching the particle to a mechanical oscillator. The mechanical oscillator can comprise any force measuring device, such as a device that translates deformation into a measurement of force. Examples of suitable mechanical oscillators include a cantilever where measuring the cantilever deflection is an indication of the force acting on the cantilever; and a spring where measuring the elongation or compression of the spring is an indication of the force acting on the spring. In accordance with the present invention, the force acting on the mechanical oscillator is related to the magnitude of the magnetic field gradient sought to be measured.

The magnetic moment of the particle mounted on the cantilever can be modulated by the action of a spatially uniform polarizing field $H_{pol}$. The polarizing field is modulated and produces temporal oscillations in the magnetic moment of the spin-containing particle at the resonance frequency of the cantilever. This creates a mechanical force that vibrates the oscillator at its resonance frequency. The vibration of the oscillator is sensed to measure the magnetic field gradient. The dynamic characteristics of the mechanical oscillator operating at resonance are used in order to narrow the bandwidth of detection, to amplify the response, and to improve the signal to noise ratio of the measurement. An additional counter-field gradient can be introduced in the measurement. This additional counter-gradient minimizes the mechanical oscillations and counteracts the effects of the field gradient under measurement on the spin-containing particle converting the measurement process into a null-measurement.

DETAILED DESCRIPTION OF THE PREFERRED EMBODIMENTS

Figure 1A:
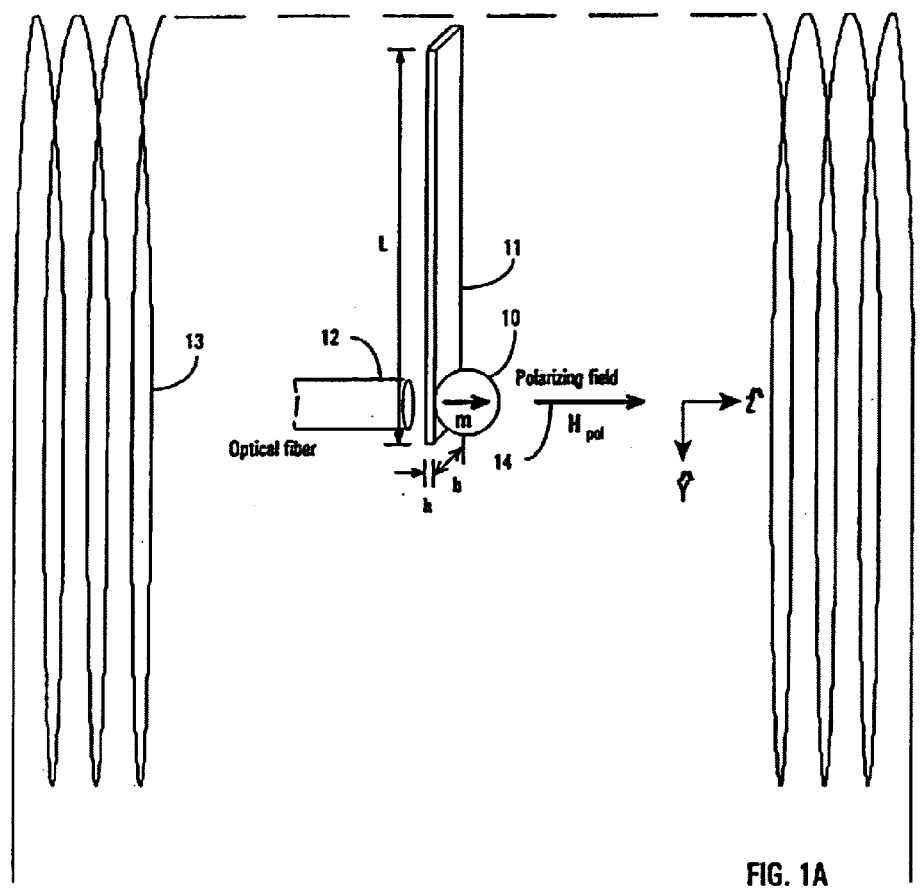
FIGS. 1A and 1B are, respectively, schematic side and top views of a spin-containing particle mounted on a cantilever inside a uniform polarizing field produced by a solenoid.

Throughout this description a magnetic field H includes uniform, $H_u$, and non-uniform, $H_{nu}$, magnetic field contributions $$\vec{H}=\vec{H}_u+\vec{H}_{nu}. \quad \text{(Eq. 1)}$$

In Equation 1, $H_u$ is independent of position at the point of measurement and over the volume subtended by the spin-containing particle. In other words, $\partial H_u/\partial r_i=0$ for i=1, 2, 3 corresponding to the position coordinates of the uniform magnetic field.

Measuring magnetic field gradients independent of $H_u$ is difficult. The detection techniques used to measure magnetic field gradients are either based on multiple measurements of H over a specified spatial distance and calculation of magnetic field gradients by spatial differences $\Delta H/|\Delta r|$, or on measurements that depend on both magnetic fields and magnetic fields gradients with a sensor whose elements are carefully constructed in order to cancel the uniform magnetic field contributions from the measured response (an example of this concept for high sensitivity magnetic induction gradients measurement instruments uses a SQUID; superconducting quantum interference device, with modified pick-up coils that suppress the $H_u$ contributions [3]). The present invention enables measurement of magnetic field gradients independent of the uniform magnetic field contributions.

In the presence of a polarizing field the magnetic moment of electrons and nuclei of a spin-containing particle align and process about $H_{pol}$ giving rise to an overall magnetic moment for the particle pointing along the direction of the polarizing field ($m_x=m_y=0$). In the presence of a magnetic field gradient the spin-containing particle with magnetic moment m will experience a magnetic force that can be expressed as $$\vec{F}=(\vec{m}\cdot\vec{\nabla})\vec{H}, \quad \text{(Eq. 2)}$$

where H is assumed almost constant over the dimensions of the spin-containing particle.

This force is measured by attaching the particle to a mechanical oscillator, such as a cantilever (or trampoline), and then measuring the deflection of the particle or cantilever. The mechanical oscillator (e.g., cantilever) translates the force exerted upon the particle with magnetic moment m by a magnetic field gradient into a proportional deflection of the particle. The mechanical oscillator (e.g., cantilever) acts as a transducer (the larger the force on the particle the larger the deflection of the cantilever).

Cantilever displacements can be monitored by optical interferometry [2] as well as by other techniques such as optical beam deflection [4], capacitance, electron tunneling, piezoelectric effect, or any other applicable measurement technique. Rather than measuring the static deflection of a cantilever we measure the oscillatory behavior of the cantilever. The high-Q (high-quality factor) mechanical resonance of the cantilevers and other mechanical oscillators for enhancing the oscillatory response of a mechanical oscillator to an applied force are employed. If the magnetic force on the particle, F, is made to oscillate at the resonance frequency of the cantilever, or at any of the cantilever harmonics, then the amplitude of the cantilever displacement will be enhanced by a factor Q. Namely, at resonance the oscillation amplitude is given by |F|Q/k, where k is the spring constant of the cantilever, and |F| is the magnitude of the oscillatory force. This oscillatory force can be created by modulating the magnetic moment m=m(t) of the particle. For this reason the preferred embodiment of the present invention uses a particle that displays a strong magnetization per mass and volume and can easily change its magnetization with time, such as permalloy.

Paramagnetic and ferromagnetic particles will align their magnetization in the direction of a polarizing magnetic field. Placing the spin-containing particle in a uniform external magnetic field (with zero field gradient) that changes in time with a frequency equal to the cantilever resonance frequency $\omega_c$, or at any of the cantilever harmonics, will produce the desired temporal changes in the magnetic moment (namely $m=m(\omega_c)$) of the particle.

To avoid creating any additional magnetic field gradient in the vicinity of the particle, the preferred embodiment of the invention positions the particle inside a region of uniform magnetic field. Such a uniform magnetic field can be provided by a solenoid or at the center of a Helmholtz coil. The magnetic field along the azimuthal axis inside a solenoid and at the center of a Helmholtz coil is substantially uniform, i.e., with $\partial H/\partial z=0$. The magnetization characteristics of the particle are preferably selected such that the magnetic moment of the particle is able to follow the temporal dependence $m=m(\omega_c)$ that oscillates at the resonance frequency of the cantilever or at any of the cantilever harmonics. In order to use a magnetic field that can reasonably be produced by a solenoid (H<0.1 T) paramagnetic or soft ferromagnetic materials should be used (preferably materials for which the coercivity is lower than the maximum magnetic field produced by the solenoid, permalloy being an example of such a material).

Figure 1B:
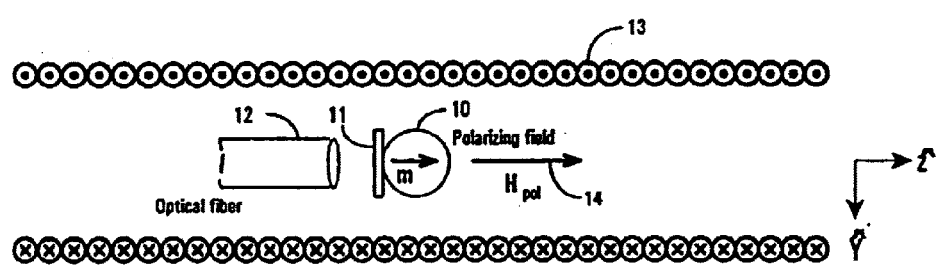

FIGS. 1A, and 1B are, respectively, schematic side and top views of a spin-containing particle mounted on a cantilever inside a uniform polarizing field produced by a solenoid. These figures depict exemplary views by which a spin-containing particle mounted at the end of a cantilever of length L and rectangular cross section of width b and thickness h can be polarized by the action of a uniform magnetic field produced inside a solenoid. In these and other figures, the ⊙ symbol represents current exiting the plane of the paper and the symbol ⊗ represents current entering the plane of the paper. A fiber optic Fabry-Perot interferometer monitors the motion of the cantilever.

Elasticity and thermodynamics principles govern the flexural motion of a beam with uniform cross section in contact with a temperature bath. Applying these principles to the preferred embodiment leads to an expression that relates the minimum detectable force at a given bandwidth to the cantilever dimensions and material properties. The minimum detectable force at resonance of a one-end-clamped cantilever is given by $$F_{min} = \sqrt{\frac{2k_B T D_n \Delta w}{\pi Q w_n}} \quad \text{(Eq. 3)}$$

where $k_B$ is the Boltzman constant, T is the temperature, $\Delta w$ is the bandwidth, and $D_n$ represents the mode dependent spring constant. For the first mode $D_n$ is given by $$D_1 = 3\frac{EI}{L^3} \quad \text{(Eq. 4)}$$

where E is the elastic Young modulus of the cantilever material, L is the length of the cantilever and I is the area moment of inertia of the cantilever which for a simple beam (of rectangular cross section) cantilever is given by $$I = \frac{bh^3}{12} \quad \text{(Eq. 5)}$$

where b and h are the width and thickness of the cantilever. [5]

A spin-containing particle 10 (this could be a paramagnetic particle or a soft-ferromagnetic particle made of materials for which the coercivity is preferably lower than the maximum magnetic field produced by the solenoid, permalloy being an example of such materials) with a time dependent magnetic moment m=m(t) produced by the action of a uniform (with zero gradient within the volume of the particle) polarizing field 14 is attached to the free end of a cantilever 11 (or any mechanical oscillator).

The time dependent uniform polarizing field 14, $H_{pol}=H_{pol}(t)$, can be created by an oscillating current flowing through a solenoid (or a Helmholtz coil or any device that produces a spatially uniform field) 13 at whose center the spin-containing particle 10 is located. The magnitude of the magnetic field at the center of a "long" (e.g., length/radius≧10) solenoid is $H_z \approx \mu_o nI/l$ (with a maximum error of approximately 2%) where $\mu_o/4\pi = 10^{-7}$ Tm/A is the permitivity of free space, n is the number of turns I is the modulated current through the solenoid and l is the length of the solenoid. The solenoid current oscillates with a frequency $\omega_c$ that corresponds to the first mechanical resonance frequency of the cantilever 11 or any of the cantilever harmonics, an example of such current may be $I=I_o \sin(\omega_c t)$.

Referring to FIG. 1A, reference numeral 12 identifies a compact optical fiber interferometer. Such interferometers have demonstrated displacement noise sensitivities of $10^{-3}$ Å on a 1 Hz bandwidth as shown by reference [6]. Such a device can be used to monitor cantilever displacement. The cantilever parameters (spring constant k, resonance frequency $\omega_c$, and Q) can be obtained by monitoring the cantilever fluctuation power spectrum and curve fitting the spectral density as discussed in reference [5]. Alternatively, the parameters can be determined by measuring the cantilever displacement to either an impulse or a periodic excitations is also discussed in reference [5]. The cantilever parameters determine the force to displacement proportionality, and for a given temperature, the minimal detectable force (as stated in Eq 3).

The spin-containing particle 10 is attached (by, for example, a non-magnetic adhesive or any other suitable approach) to the free end of a cantilever 11. A cantilever 11 having a low spring constant and a high-Q is preferable for obtaining better resolution, but not necessary. Cantilevers with $F_{min} \sim 10^{-18}$N have been demonstrated as discussed in reference [7]. Such cantilevers have been made of Si and have typical dimensions of 400 μm long, 6 μm wide, and 500 Å thick with a reflecting palate 20 μm wide. A 20 μm diameter Ni spherical particle can be attached on a palate located at the end of the cantilever 11. By measuring the cantilever 11 parameters before and after the spin-containing particle is mounted the mass of the spin-containing particle can be obtained. Such an measurement is discussed in reference [5].

Figure 2A:
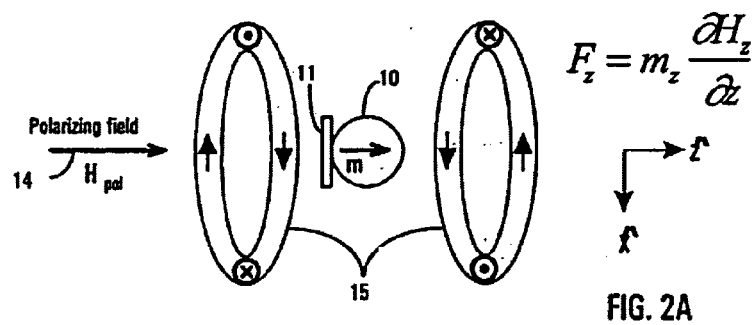
FIG. 2A is a schematic view depicting a top view of a spin-containing particle in a uniform polarizing field mounted on a cantilever within an anti-Helmholtz coil with azimuthal axis substantially collinear with the polarizing field.
Figure 2C:
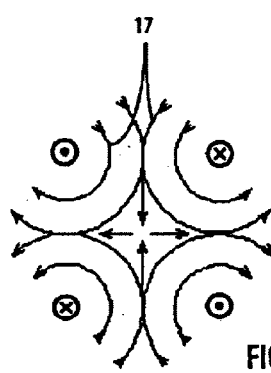
FIG. 2C, is a schematic view depicting a field produced by a quadrupole coil.
Figure 2B:
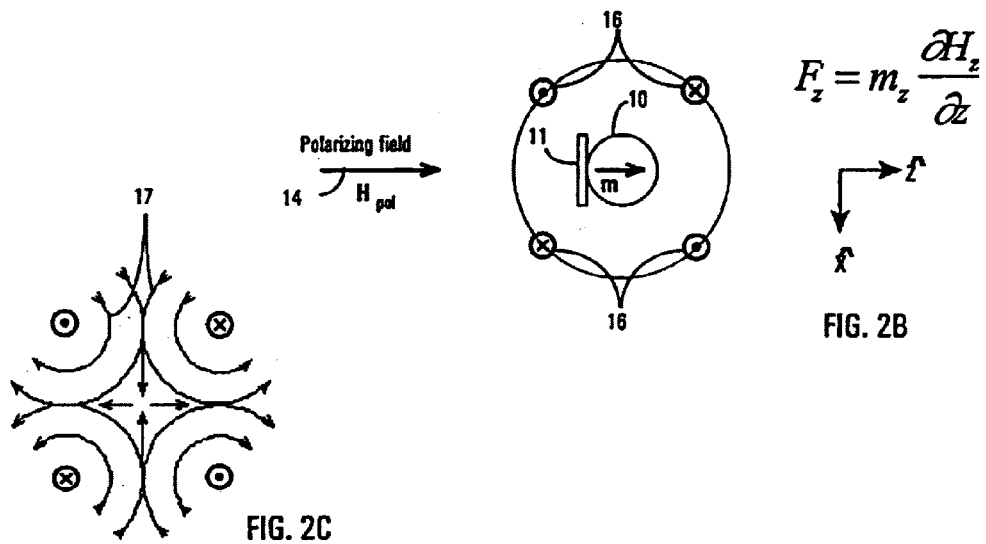
FIG. 2B, is a schematic view depicting a top view of a spin-containing particle in a uniform polarizing field mounted on a cantilever surrounded by a quadrupole coil producing a field gradient substantially collinear with the polarizing field.

To measure the magnetic moment of the attached particle (for Ni the reported magnetization of 55 J/Tkg and density of 8.9 g/cm³ would produce a fully saturated magnetic moment for a 20 μm diameter Ni spherical particle of the order of 2 J/T), AC cantilever magnetometry can be performed in-situ with the same apparatus as described in FIGS. 2B and 2C. Such measurement techniques are known and are discussed and shown in reference [8]. In this case a known time dependent field gradient at the resonance frequency of the cantilever 11 could be produced with a quadrupole coil 16. The cantilever 11 deflection constitutes a measurement of the force, and hence the magnetic moment as a function of a steady uniform field produced by the solenoid 13. For the described 20 μm diameter Ni spherical particle mounted on the cantilever 11 with $10^{-18}$ N, a minimum detectable force with a minimum magnetic field gradient of 0.5 nT/m could be detected.

Figure 1C:
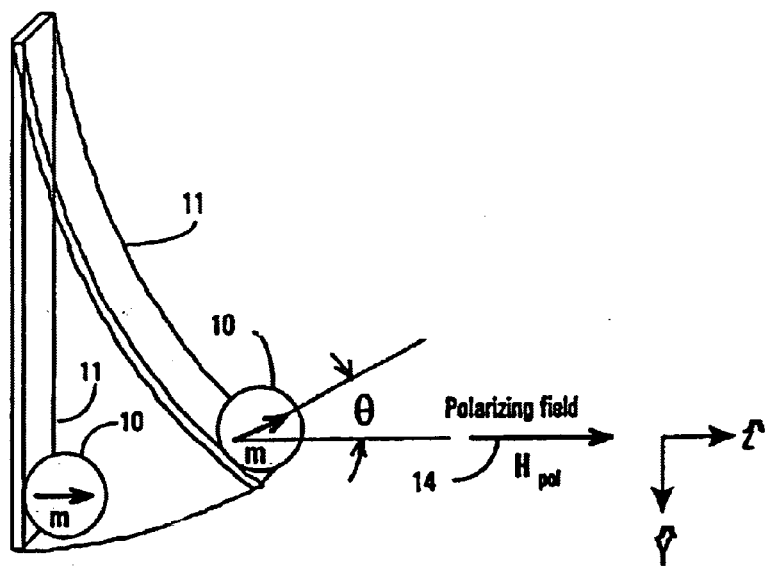
FIG. 1C is a schematic view depicting a change of direction of the magnetic moment of a spin-containing particle upon cantilever displacement.

In the preferred embodiment of the present invention, the magnetic moment will be aligned with the direction of the polarizing field. Given the configuration geometry depicted in FIGS. 1A and 1B, as long as the cantilever 11 is not displaced, the direction of the polarizing field and the direction of the magnetic moment are co-linear. However, as soon as the cantilever 11 is displaced, as shown in FIG. 1C, this is no longer the case. The realignment of the magnetization within the particle along the polarizing field will have a stiffening effect on the cantilever 11 (a magnetic alignment contribution to the spring constant) as demonstrated in reference [8]. There are several ways to avoid such an effect, examples of which are:

a) applying a counter-field gradient onto the particle-cantilever system ito cancel the field gradient under measurement and therefore null the force and displacement of the particle-cantilever system; and b) orientating the magnetic moment of the apparatus perpendicular to the direction of cantilever motion so that the direction of the magnetic moment of the spin-containing particle ($F_z$ in FIG. 1D) is substantially independent of the cantilever bending position.

To implement an example of a null force measurement, a counter-field gradient with no uniform field contribution is used. Such field gradients can be obtained either by an anti-Helmholtz coil as depicted in FIG. 2A, or by a quadrupole coil as depicted in FIG. 2B. The magnetic field 17 shown in FIG. 2C at the center of such arrangements is almost zero.

In the case where the direction of the magnetic moment of the spin-containing particle is independent of the cantilever bending position a null measurement can also be implemented. This arrangement is depicted in FIG. 2C in which a force $$F_z = m_x \frac{\partial H_z}{\partial x}$$

is counteracted by the action of the quadrupole coil.

FIGS. 2A, 2B, 2D, and 2E schematically depict various configurations by which magnetic field gradients can be detected and measured. Such detection and measurement is accomplished by the application of a counter-field gradient that nulls the force exerted by the magnetic field gradient under measurement acting on a spin-containing particle 10 with magnetic moment m mounted at the free end of cantilever 11. Therefore by generating a counter-field gradient such that the displacement of the cantilever 11 is forced to zero by the action of the counter-field gradient, the field gradient can be measured.

In FIG. 2A, an anti-Helmholtz coil 15 (FIG. 3) is used to produce the counter-field gradient and null the force $$F_z = m_z \frac{\partial H_z}{\partial z}.$$

In this case an error current in proportion to the cantilever displacement is applied to the anti-Helmholtz coil 15. Measurement of the gradient can be made by monitoring the error current (i.e., the counter-field gradient produced by the error current).

In FIG. 2B, an anti-quadrupole coil 16 is used to produce the counter-field gradient and null the force $$F_z = m_z \frac{\partial H_z}{\partial z}.$$

Once again in this case an error current in proportion to the cantilever displacement is fed into the anti-quadrupole coil 16. Measurement of the gradient can be made by monitoring the error current (i.e., the counter-field gradient produced by the error current).

Figure 1D:
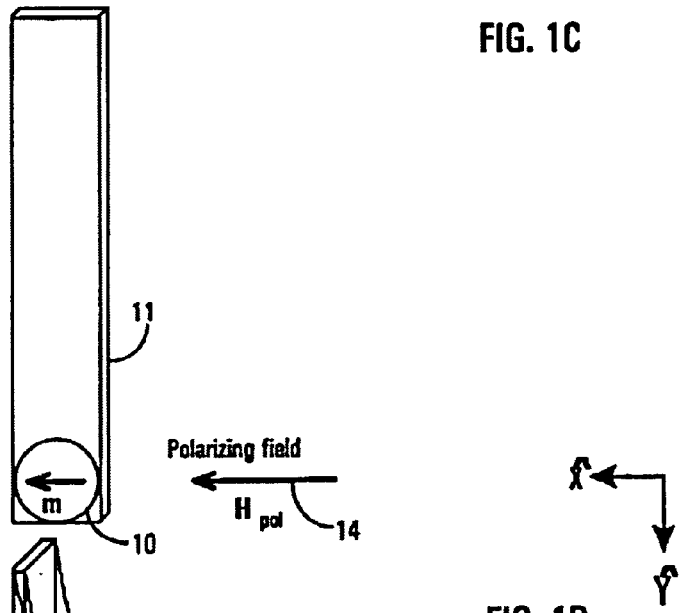
FIG. 1D is a schematic view depicting a geometric configuration with the polarizing field and the magnetic moment of the spin-containing particle pointing along the width of the cantilever.
Figure 1E:
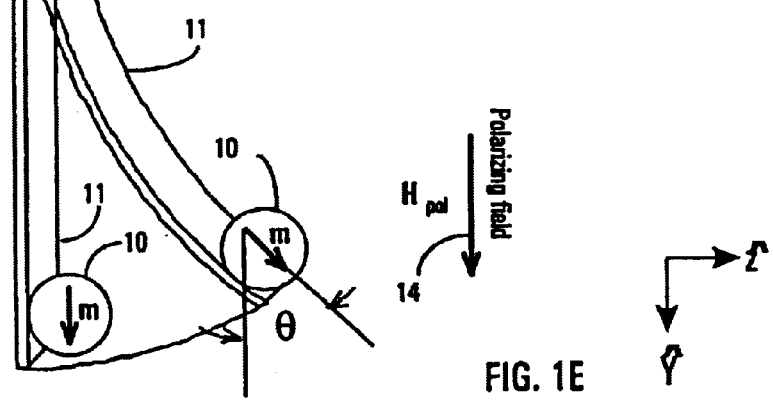
FIG. 1E is a schematic view depicting a geometric configuration with the polarizing field and the magnetic moment of the spin-containing particle pointing along the length of the cantilever.
Figure 2D:
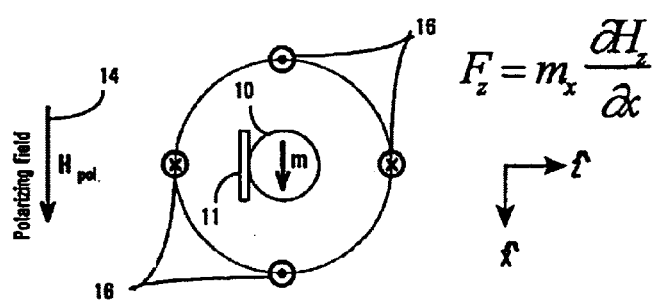
FIG. 2D, is a schematic view depicting a top view of a spin-containing particle in a uniform polarizing field and mounted on a cantilever within a quadrupole producing a field gradient substantially perpendicular to the polarizing field.

In FIG. 2D, an anti-quadrupole coil 16 is used in combination with the geometry of FIG. 1D to produce the counter-field gradient and null the force $$F_z = m_x \frac{\partial H_z}{\partial x}.$$

Once again in this case an error current in proportion to the cantilever displacement is fed into the anti-quadrupole coil 16. Measurement of the gradient can be made by monitoring the error current (i.e., the current applied to the coil that produces the field gradient that nulls the cantilever displacement).

Figure 2E:
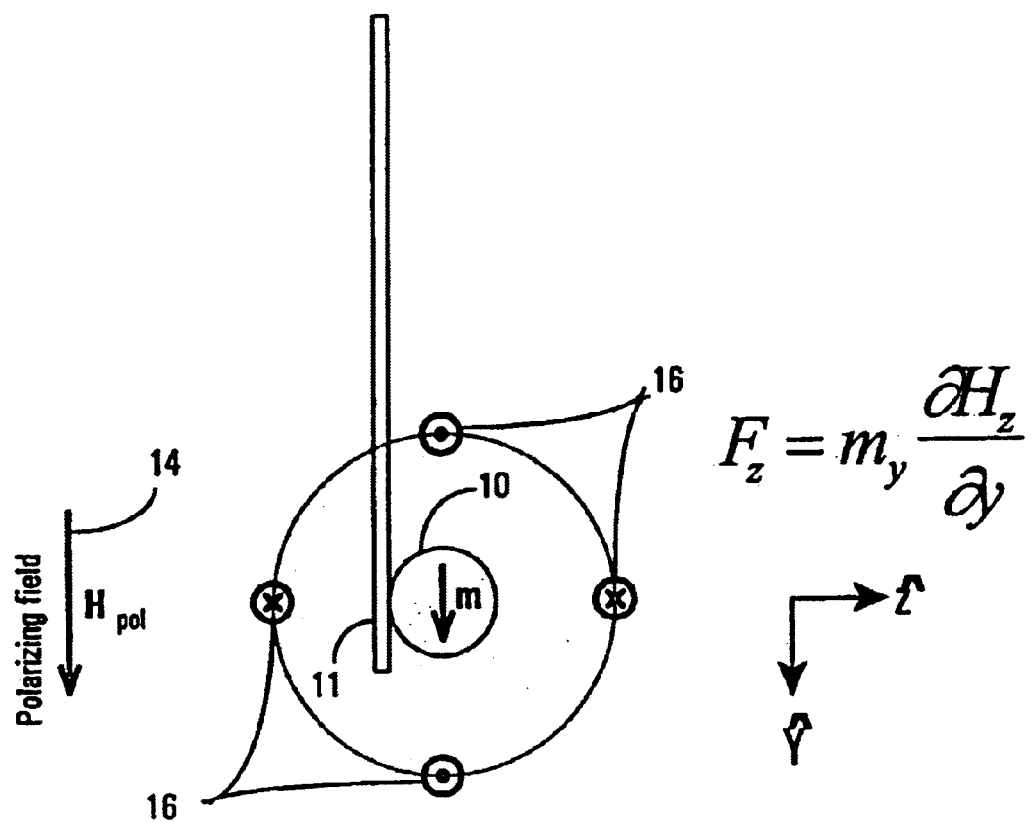

In FIG. 2E, an anti-quadrupole coil 16 is used in combination with the geometry of FIG. 1D to produce the counter-field gradient and null the force $$F_z = m_y \frac{\partial H_z}{\partial y}.$$

Once again in this case an error current in proportion to the cantilever displacement is fed into the anti-quadrupole coil 16. Measurement of the gradient can be made by monitoring the error current (i.e. the current applied to the coil that produces the field gradient that nulls the cantilever displacement).

Figure 3:
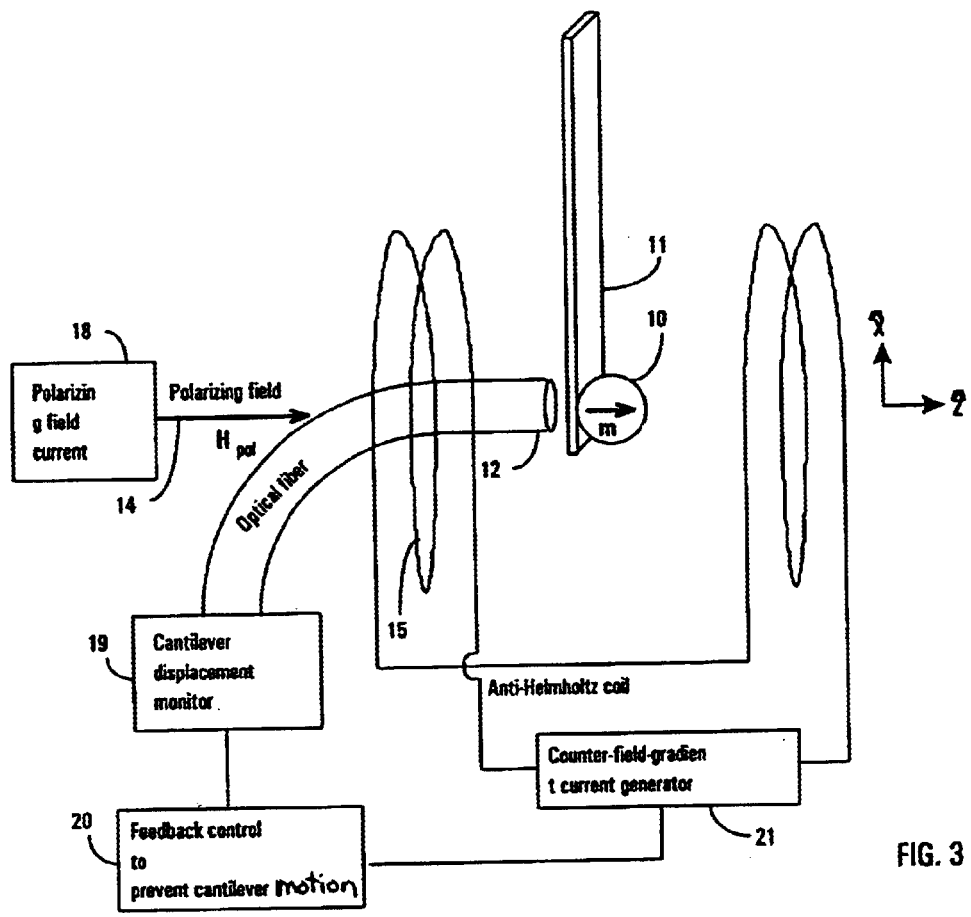
FIG. 3, is a schematic a block diagram of a system embodying the present invention.

FIG. 3, is a schematic block diagram of a system embodying the present invention. Referring to FIG. 3, a current generator 18 produces a modulated current circulating through the polarizing coil 13 (located inside or outside of the anti-Helmholtz coil 15 and shown in FIGS. 1A and 1B). with a current producing a polarizing field $H_{pol}$ 14 large enough to produce a net magnetization of the spin-containing particle 10 pointing in the polarizing field 14 direction. The current produced at 18 is, in general, modulated at the mechanical resonance frequency $\omega_c$ of the cantilever 11 or at any of the cantilever harmonics. The displacement of the cantilever 11 is monitored by either a fiber optic Fabry-Perot interferometer or other displacement monitoring device 19 suitable for monitoring small displacements. A feedback control device 20 (this can be any known analog or digital control device) generates a field gradient control signal that is used in generating a field gradient to counteract the cantilever 11 displacement. A current generator 21 drives the anti-Helmholtz or quadrupole coil in response to the field gradient control signal.

In cases where the magnetic field gradient under measurement is modulated, combinations of frequencies between the polarizing field generator (current generator 18) and the generator for the anti-gradient coil (current generator 21) could be arranged such that either the sum or difference of such frequencies almost matches the cantilever resonance frequency $\omega_c$ or any of the cantilever harmonics.

What is claimed is:

1. A method for measuring a magnetic field gradient, comprising:

generating a polarizing magnetic field;

placing a spin-containing particle in the polarizing magnetic field;

measuring a displacement of the spin-containing particle;

wherein the generating the polarizing magnetic field includes varying the polarizing magnetic field;

generating a uniform magnetic field acting upon the spin-containing particle;

generating the polarizing magnetic field in a direction substantially perpendicular to the displacement;

wherein placing the spin-containing particle includes placing the spin-containing particle on a mechanical oscillator having a resonance frequency, and the spin-containing particle has a magnetic moment, and wherein the generating the polarizing magnetic field includes varying the polarizing magnetic field in accordance with the resonance frequency of the mechanical oscillator.

2. A method for measuring a magnetic field gradient, comprising:

generating a polarizing magnetic field;

placing a spin-containing particle in the polarizing magnetic field;

measuring a displacement of the spin-containing particle;

generating a counter gradient magnetic field;

varying the counter gradient magnetic field based on the displacement;

wherein placing the spin-containing particle includes placing the spin-containing particle on a mechanical oscillator;

wherein varying the counter gradient magnetic field based on the displacement includes varying the counter gradient magnetic field so as to reduce the displacement to approximately zero; and placing the spin-containing particle includes placing the spin-containing particle on a mechanical oscillator.

3. An apparatus for measuring a magnetic field gradient, comprising:

a first coil operatively connected to generate a polarizing magnetic field;

a spin-containing particle positioned in the polarizing magnetic field;

means for measuring a displacement of the spin-containing particle; and further comprising a circuit operatively connected to the first coil for varying the polarizing magnetic field.

4. An apparatus for measuring a magnetic field gradient according to claim 3, further comprising a circuit operatively connected to generate a uniform magnetic field and positioned so that the uniform magnetic field acts on the spin-containing particle.

5. An apparatus for measuring a magnetic field gradient, comprising:
- a first coil operatively connected to generate a polarizing magnetic field;
- a spin-containing particle positioned in the polarizing magnetic field;
- means for measuring a displacement of the spin-containing particle; and
- further comprising a second coil for producing a counter field gradient.

6. An apparatus for measuring a magnetic field gradient according to claim 5, wherein said second coil is an anti-Helmholtz coil.

7. An apparatus for measuring according to claim 5, wherein said second coil is an anti-quadruple coil.

* * * * *